United States Patent [19]

Hellegaard

[11] Patent Number: 4,607,171

[45] Date of Patent: Aug. 19, 1986

[54] ELECTRONIC SWITCHING APPARATUS

[75] Inventor: Kjeld Hellegaard, Bjerringbro, Denmark

[73] Assignee: Danfoss A/S, Nordborg, Denmark

[21] Appl. No.: 645,782

[22] Filed: Aug. 30, 1984

[30] Foreign Application Priority Data

Sep. 17, 1983 [DE] Fed. Rep. of Germany ....... 3333653

[51] Int. Cl.$^4$ ........................... H03K 7/26; H03K 3/33
[52] U.S. Cl. ................................. 307/270; 307/254; 307/280; 307/300; 307/315
[58] Field of Search ............... 307/270, 253, 300, 280, 307/315, 254

[56] References Cited

U.S. PATENT DOCUMENTS 3,959,669  5/1976  Peters ................................. 307/300
4,215,279  7/1980  Lataire et al. ..................... 307/270
4,399,500  8/1983  Clarke et al. ..................... 307/270

Primary Examiner—Stanley D. Miller
Assistant Examiner—B. P. Davis
Attorney, Agent, or Firm—Wayne B. Easton

[57] ABSTRACT

The invention relates to an electronic switching apparatus having a power transistor as a switching element and an RCD circuit in parallel with the CE path of the power transistor. The apparatus has an anti-saturation circuit with a diode thereof connected to the junction between the capacitor and resistor of the RCD circuit so that the anti-saturation circuit only becomes effective when the RCD capacitor has discharged the high operating voltage to below the low control voltage of the control signal generator.

5 Claims, 6 Drawing Figures

ELECTRONIC SWITCHING APPARATUS

The invention relates to an electronic switching apparatus comprising a power transistor as switching element, an RCD circuit which is in parallel with the collector-emitter path of the power transistor and which has a condenser in series with a diode having its pass direction the same as the pass direction of the power transistor and a discharge transistor, possibly a recovery diode to protect the power transistor with an inductive consumer, a control signal generator, a switching stage comprising the power transistor and an anti-saturation circuit which has at least one diode and is disposed between the control signal generator and a point of the RCD circuit.

In a known switching apparatus of this kind, the diode of the anti-saturation circuit is connected directly to the collector of the power transistor. When operating the power transistor, its collector-emitter voltage therefore immediately drops to almost zero. However, its base current drops correspondingly rapidly because part of the base current is branched off through the anti-saturation diode and the collector-emitter path of the power transistor. By reason of the inhibiting delay period of the diode, the base current first fluctuates for a short time about a very low value and only thereafter comes to a value which is sufficiently high to maintain the power transistor in the desired switched-on condition. Because of the delay in reaching sufficient operation, undesired switching-on losses are produced. In addition, because of the rapid and high voltage jump at the collector of the power transistor, high requirements are placed on the change-over speed of the anti-saturation diode which is connected to this collector and which must also be a high voltage diode. Carrying out the switching stage with a control voltage or a control current having a conventionally high and steep peak and an adjoining constant section will then hardly relieve the load on the power transistor.

The invention is based on the problem of providing a switching apparatus of the aforementioned kind which, at little expense, will involve low change-over losses for the power transistor.

According to the invention, this problem is solved in that the diode of the anti-saturation circuit is connected to the junction between the condenser and discharge resistor of the RCD circuit.

In this solution, the anti-saturation circuit becomes effective only when the condenser of the RCD circuit has discharged from the high operating voltage (possibly twice its value) to below the low control voltage of the control signal generator. The power transistor is therefore rapidly brought without marked switching losses to the desired switched-on condition. Since the voltage at the condenser decreases only at a speed corresponding to its discharge time constant, the voltage at the diode of the anti-saturation circuit will also drop correspondingly more slowly. The diode need therefore not be a high speed diode. In addition, the condenser has a stabilising effect on the control current so that the base-emitter current of the power transistor drops rapidly but not too rapidly when the power transistor is operated. After an ignition current peak, its base current can first be held at a medium value so that the power transistor is operated sufficiently before the base current is reduced by the anti-saturation diode. A current flows through the diode of the anti-saturation circuit, the discharge resistor and the collector-emitter path of the power transistor. In this way, a much lower base current will be sufficient and the amplification of the power transistor will be utilised.

Preferably, the condenser is discharged through the base-emitter path of the power transistor. In this way, the charge of the condenser is likewise employed to operate the power transistor and rapid switching-on of the power transistor is ensured with correspondingly low change-over losses.

Further, the collector-emitter path of a control transistor may be in series with an uncoupling diode which is poled in the same sense and disposed between the collector and base of the power transistor, and the discharge resistor of the RCD circuit may be connected with the junction between the uncoupling diode and the control transistor. Whilst the discharge current of the condenser continues to be fed by way of the collector-emitter path of the control transistor to the base of the power transistor to relieve the control current, it is nevertheless ensured that the base current reduction across the anti-saturation circuit will not, as with a direct connection between the anti-saturation diode and power transistor, lead to substantial blocking of the power transistor because of this base current reduction with the result of a rise in the collector-emitter voltage of the power transistor and defective discharging of the condenser up to the next time that the power transistor is switched on. In the case of an inverter with an inductive load, the uncoupling diode prevents the condenser from being discharged when the recovery diode is conductive.

The signal transmission stage may contain an RC element which gives this stage a following transmission behaviour so as to obtain particularly rapid initial operation of the power transistor.

The invention and its developments will now be described in more detail in relation to preferred examples with reference to the drawing, wherein.

Figure 1:
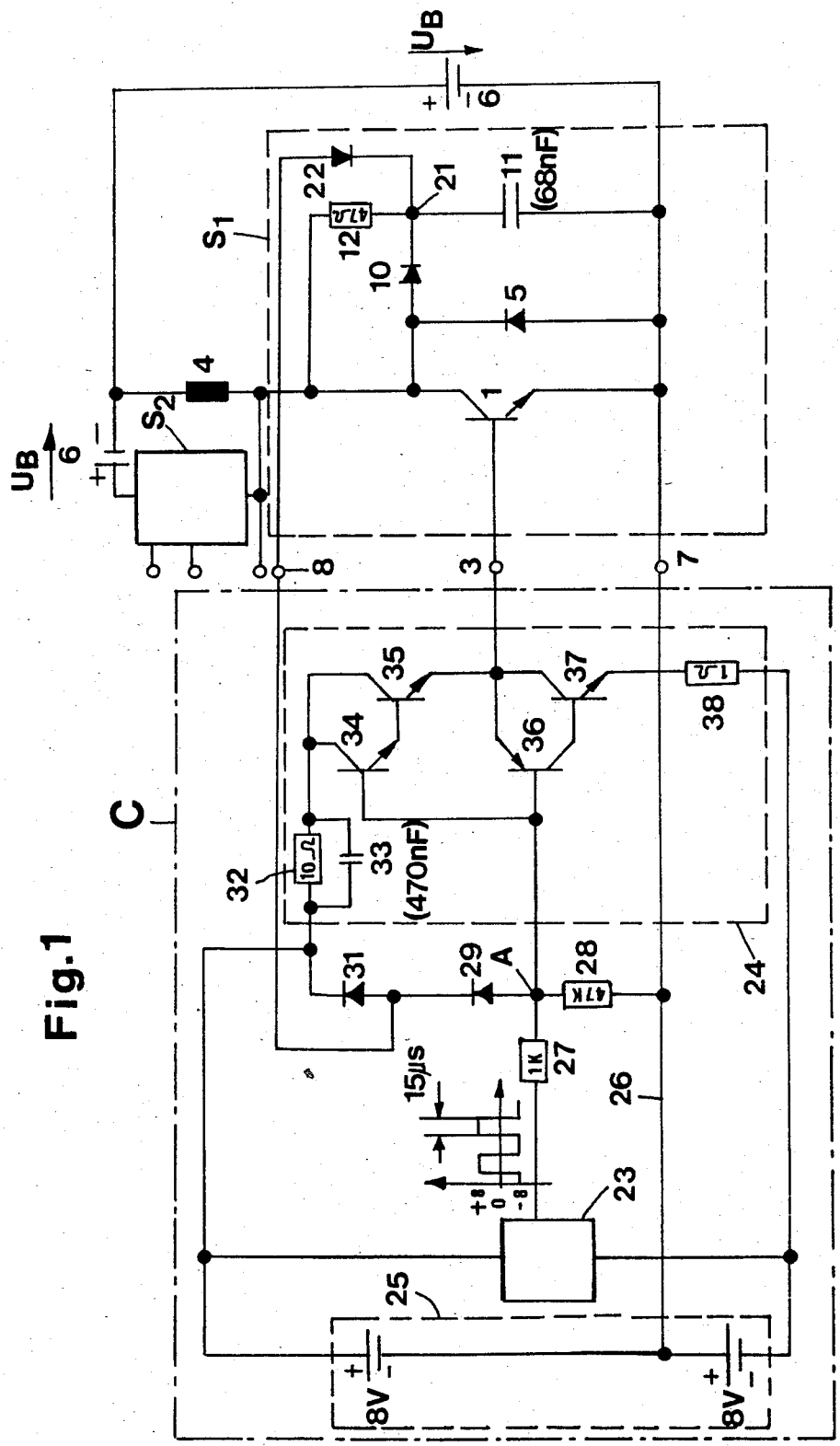
FIG. 1 shows a first example of an electronic switching apparatus according to the invention.

In the example of FIG. 1, the switching apparatus contains two alternately operable switching stages $S_1$ and $S_2$ of like construction and controllable by a respective separate control stage C. To simplify the representation, only the control stage C for the switching stage $S_1$ is shown in more detail.

The switching stage $S_1$ contains a power transistor 1 as the switching element. The base of the power transistor 1 is connected to a control terminal 3. An inductive consumer 4 is in series with the power transistor 1. Parallel to the collector-emitter path of the power transistor 1 there is a recovery diode 5 poled oppositely thereto. The series circuit consisting of the consumer 4 and power transistor 1 is applied to an operating voltage source 6 which produces a D.C. voltage $U_B$ of about 300 volt. The emitter of the power transistor 1 is connected to a second control terminal 7, the control terminals 3 and 7 forming the control input of the switching stage $S_1$. The control terminals are supplied with control signals from the control stage C.

Parallel to the collector-emitter path of the power transistor 1 there is a series circuit consisting of a diode 10 and a condenser 11, the diode 10 being poled in the same sense as the power transistor 1. An ohmic discharge resistor 12 is in parallel with the diode 10. An anti-saturation diode 22 between a further input terminal 8 of the switching stage $S_1$ and the junction 21 of the resistor 12 and condenser 11 has its anode connected to the input terminal 8 and its cathode connected to the junction 21.

The control stage C contains a control signal generator 23 and a control signal transmission stage 24. The control signal generator 23 is fed from a voltage source 25 which produces a D.C. voltage of 16 volt and has a central tapping which is connected to the control terminal 7 by a neutral conductor 26. The control signal produced by the control signal generator 23 is rectangular and symmetrical to the zero point of the voltage source 25. The pulse width of the control pulses amounts to at least about 15 microseconds. The control signal is supplied to the input of the control signal transmission stage 24 by way of a voltage divider which is disposed between the output of the control signal generator 23 and the neutral conductor 26 and which consists of ohmic resistors 27, 28 of 1 kiloohm and 4.7 kiloohm. Two diodes 29 and 31 are in series in the same sense between the tapping A of the voltage divider 27, 28 and the plus pole of the voltage source 25, the cathode of diode 29 being connected to the plus pole of the voltage source 25. The cathode of diode 29 is connected by way of the input terminal 8 of the switching stage $S_1$ to the anode of the antisaturation diode 22. Further, applied to the voltage source 25 in series there are: an RC element consisting of an ohmic resistor 32 of 10 ohm and, in shunt therewith, a condenser 33 of 470 nanofarad, a Darlington circuit formed by two transistors 34 and 35, a further Darlington circuit formed by two transistors 36 and 37, and an ohmic resistor 38 of 1 ohm. The bases of the two control transistors 34, 36 of the two Darlington circuits are connected to the tapping A of the voltage divider 27, 28. The control transistor 36 of the second Darlington circuit is a pnp transistor whereas the other transistors 34, 35, 37 of the Darlington circuits are npn transistors.

If the control signal generator 23 produces a negative pulse, the transistors 36, 37 are switched on (conductive) and the transistor 1 is switched off (blocked) so that the condenser 11 gradually charges by way of the diode 10 and consumer 4 to twice the voltage $U_B$ of the D.C. voltage source 6. The condenser 11 ensures that the collector-emitter voltage of the previously conductive power transistor 1 does not rise with a leap before the load current flowing through the power transistor 1 has markedly dropped. Otherwise an excessively high power loss would be converted in the power transistor 1. This, however, requires that the condenser 11 was sufficiently discharged previously, i.e. in the conductive state of the power transistor 1. Discharging takes place during a positive pulse of the control signal of the control signal generator 23. This pulse switches on the transistors 34, 35 and thus also the transistor 1 at the instant $t_1$, so that the condenser 11 discharges through the resistor 12 and the collector-emitter path of the power transistor 1 and the voltage $U_{11}$ and the condenser 11 decreases in accordance with FIG. 2. The discharging occurs immediately with the positive control pulse because the condenser 33 at the first instant practically constitutes a short-circuit so that the power transistor 1 is fully operated as will be shown by the course of the collector-emitter voltage $U_{CE}$ of the power transistor in FIG. 4. The diodes 29 and 22 remain blocked for as long as the voltage at the condenser 11 is higher than the control pulse at the tapping A. As soon as the voltage $U_{11}$ at the condenser 11 (the potential of the point 21) is lower than the control pulse at the tapping A of the voltage divider 27, 28 or at the input of the control signal transmission stage 24, which is the case at the instant $t_2$, the diodes 29 and 22 also become conductive. The voltage drop at the diodes 29 and 22 and the resistor 12 is altogether substantially equal to the voltage drop at the base-emitter paths of the transistors 34 and 35 of which the voltage drops each substantially correspond to that of a diode. The potential of the base of the power transistor 1 is therefore about the same as (practically somewhat lower than) the potential of the collector of the power transistor 1, the voltage drop at the resistor 12 being negligibly small. The power transistor 1 is thus not operated far into saturation. The condenser 11 can therefore discharge to a voltage which is substantially equal to the very low collector-emitter voltage of the saturated, but not over-saturated, power transistor 1. During discharging of the condenser 11 between the instants $t_1$ and $t_2$ according to FIG. 3, the base current $I_B$ of the power transistor 1 is also limited because in the meantime the condenser 33 is charged and the base current $I_B$ of the power transistor 1 is now only determined by the resistor 32. Upon completed discharging of the condenser 11 at the instant $t_2$, the diodes 29 and 22 becoming conductive results in the potential at the tapping A and thus the base current (FIG. 3) of the power transistor 1 decreasing still further. When the next negative control pulse then arises, the transistor 1 is very rapidly switched off because it (now) only stores relatively small charges in its base that cause the switching-off to be delayed until they are discharged. On the whole, therefore, there is very rapid switching-on of the power transistor 1 because of the initial base current peak (FIG. 3) by way of the condenser 33 in conjunction with the short maintenance of the subsequent base current intermediate value and very rapid switching-off of the power transistor 1 on account of preventing over-saturation of the power transistor 1 by the diodes 22 and 29 without placing high requirements on the change-over speed of the diodes 22, 29 because of gradual discharging of the condenser 11.

Figure 2:
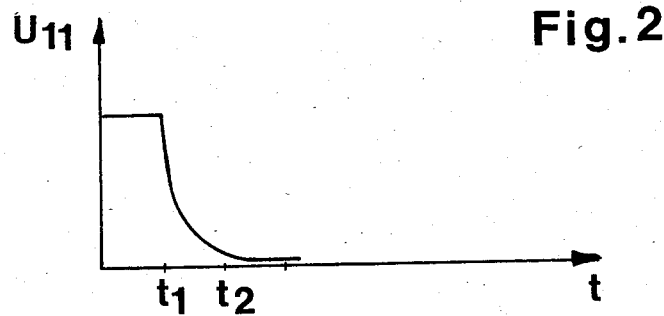
FIGS. 2 to 5 are graphs of the voltage and current to explain the operation and advantages of the switching apparatus according to the invention.
Figure 3:
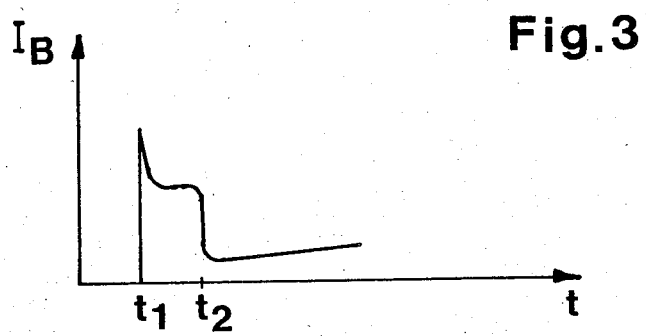
Figure 4:
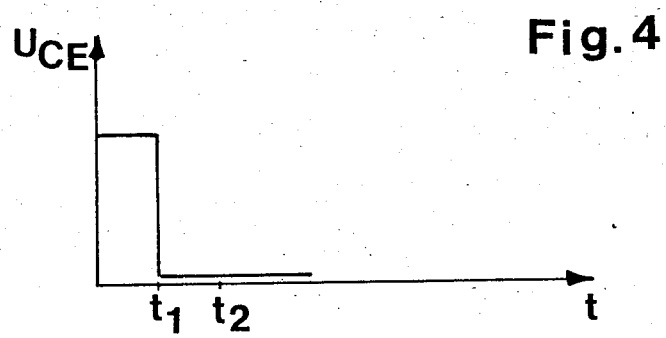
Figure 5:
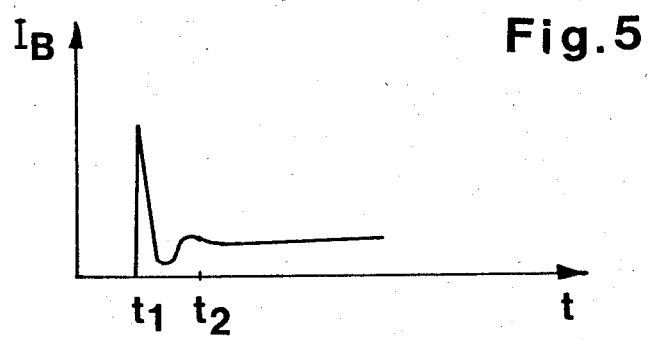

A comparison of the condenser voltage $U_{11}$ shown in FIGS. 2 and 3 and the base current $I_B$ of the power transistor of the switching apparatus according to FIG. 1 with the collector-emitter voltage $U_C$ shown in FIGS. 4 and 5 and the base current $I_B$ of the power transistor in a known switching apparatus in which the anti-saturation diode is connected direct to the collector of the power transistor shows that in the known circuit the collector-emitter voltage $U_{CE}$ immediately drops to practically zero as in the FIG. 1 switching apparatus when switching on the power transistor at the instant $t_1$, so that the anti-saturation diode is in the known case loaded by a very rapid voltage leap. Also, the base current $I_B$ in the known case of FIG. 5 is prematurely reduced by way of the anti-saturation diode, the power transistor is practically immediately substantially blocked again, and the condenser of the RCD circuit is not adequately discharged during the conductive period of the power transistor. In contrast, when connecting the anti-saturation diode 22 at the junction 21 in accordance with FIG. 1, the base current is not reduced immediately upon supplying a switching-on pulse, as is shown in FIG. 3. The condenser 11 can therefore be sufficiently discharged. Since discharging does not occur with a jerk, the requirements placed on the change-over speed of diode 22 are less. In addition, the condenser 11 facilitates a base current which is free from oscillations. The power transistor is operated more effectively.

Figure 6:
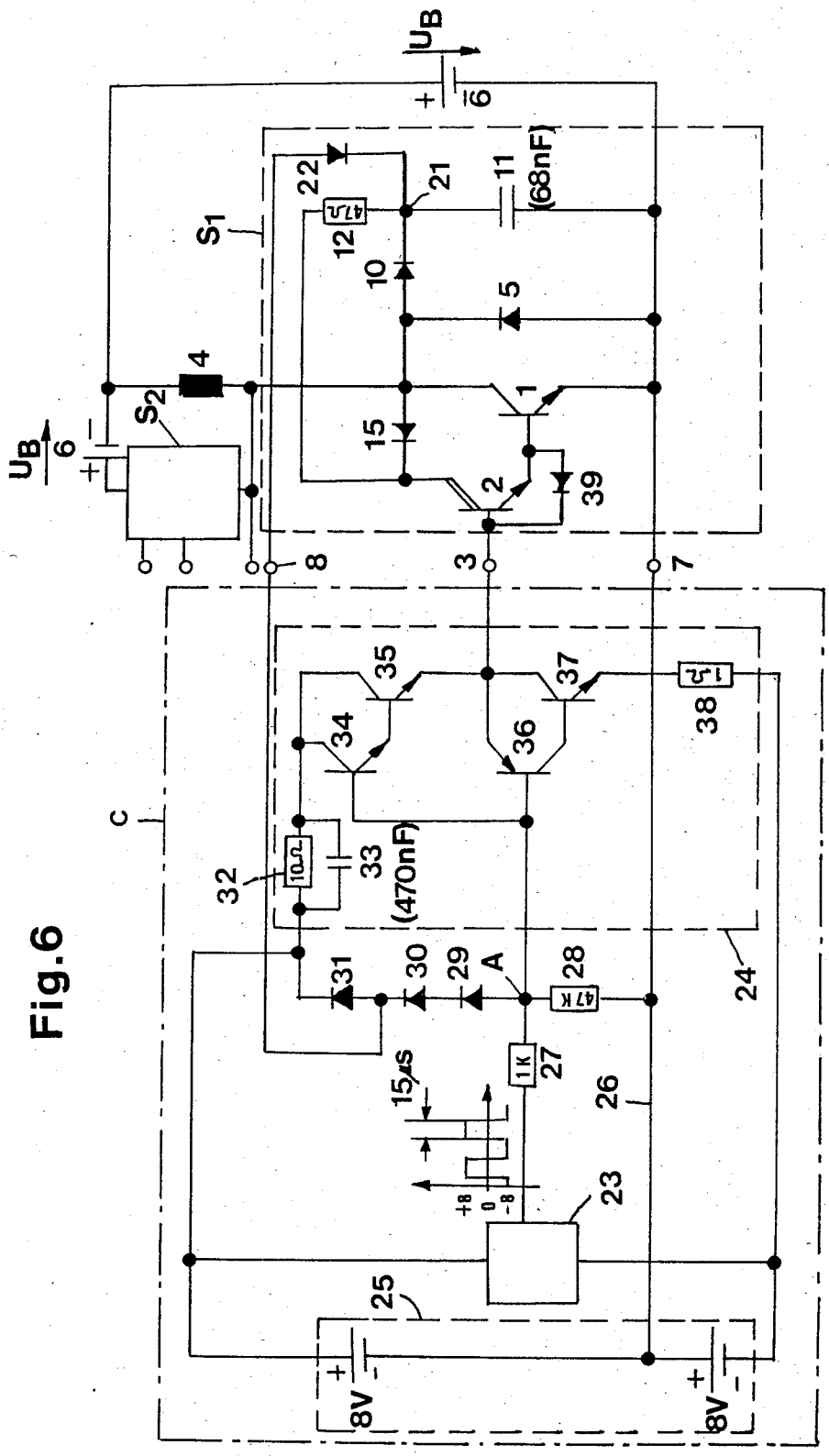
FIG. 6 shows a second example of an electronic switching apparatus according to the invention.

FIG. 6 illustrates a second example which differs from that of FIG. 1 as follows. Between the control terminal 3 and the base of the power transistor 1, there is the base-emitter path of a control transistor 2 in the form of a Darlington transistor (two transistors in Darlington circuit). The collector of the control transistor 2 is connected to the cathode of an uncoupling diode 15 of which the anode is connected to the collector of the power transistor 1. The discharge resistor 12 is between the junction 21 and the collector of the control transistor 2. To compensate the voltage drop at the base-emitter path of the control transistor 2, there is a further diode 30 between the diodes 29 and 22. An additional diode 39, of which the cathode is connected to the base of the control transistor 2 and the anode to the base of the power transistor 1, enables the power transistor to be switched off.

In this example, the condenser 11 does not discharge through the collector-emitter path of the power transistor 1 but through the collector-emitter path of the control transistor 2 and the base-emitter path of the power transistor 1. The discharge current of condenser 11 does therefore not additionally load the collector-emitter path of the power transistor 1 and the control current for the switching stage $S_1$ can be correspondingly reduced. Compared with a construction in which the collectors of transistors 1 and 2 are connected, the uncoupling diode 15 prevents the condenser 11 from discharging through the recovery diode 5 when the latter is conductive because of the inductive consumer 4. At the same time, the uncoupling diode 15 permits somewhat further discharging of the condenser 11 because the collector potential of the control transistor 2 when the transistors 1 and 2 are conductive is lower than the collector potential of the power transistor 1 by the voltage drop of the uncoupling diode 15. In other respects, the operation of the FIG. 6 example is much the same as that of FIG. 1.

Instead of the illustrated two-phase inverter arrangement with the two switching stages $S_1$ and $S_2$ which alternately permit a current to flow in opposite directions through the consumer 4, it is also possible to employ single-phase versions in which, in comparison with the illustrated examples, merely the second switching stage $S_2$ and its DC voltage source 6 are omitted and the recovery diode 5 is connected in parallel to the consumer 4.

I claim:

1. Electronic switching apparatus, comprising, a power transistor operable as a switching device, said transistor having collector and base elements and an emitter, first diode means and capacitor means in series with the annode of said first diode means being connected to said transistor collector element and said capacitor being connected to said transistor emitter, resistor means having one end thereof connected to the junction of said first diode means and said capacitor means and the other end thereof connected to one of said transistor elements, said capacitor means being chargeable through said diode means during the off period of said transistor, signal generating means for producing a control signal at the output thereof, control signal transmission means beteen said control signal output and said power transistor base element, and anti-saturation circuit means including second diode means between said control signal output and said junction of said first diode means and said capacitor means poled in the direction of said junction, said anti-saturation means being operable upon said transistor being turned on to reduce the potential difference between said transistor collector and base elements to limit the extent to which said transistor goes into saturation.

2. Electronic switching apparatus according to claim 1 wherein said resistor means has said other end thereof connected to said transistor collector element so that said capacitor is discharged by way of the collector emitter path of said transistor.

3. Electronic switching apparatus according to claim 1 wherein said resistor means has said other end thereof connected to said transistor base element so that said capacitor is discharged by way of said base-emitter path of said transistor.

4. Electronic switching apparatus according to claim 1 wherein said signal generating means output is formed by voltage divider means, said control signal transmission means including control transistor means, said second diode means having a total voltage drop about the same as the total voltage drop of said control transistor means to effect limiting of the extent to which said power transistor goes into saturation.

5. Electronic switching apparatus according to claim 1 wherein said control signal transmission means includes Darlington transistor arrangements.

* * * * *